United States Patent
Grodnensky (10) Patent No.: US 9,303,137 B2
(45) Date of Patent: Apr. 5, 2016

(54) NANOCOMPOSITE MATERIAL CONTAINING ALUMINA NANOFIBERS AND METHOD FOR MAKING SAME

(71) Applicant: ANF Technology Limited, Warlingham, Surrey (GB)

(72) Inventor: Ilya Grodnensky, Foster City, CA (US)

(73) Assignee: ANF Technology Limited, Warlingham (GB)

( * ) Notice: Subject to any disclaimer, the term of this patent is extended or adjusted under 35 U.S.C. 154(b) by 425 days.

(21) Appl. No.: 13/783,295

(22) Filed: Mar. 2, 2013

(65) Prior Publication Data
US 2014/0249261 A1  Sep. 4, 2014

(51) Int. Cl.
| | | |
|---|---|---|
| *C08J 3/22* | (2006.01) | |
| *C08K 3/22* | (2006.01) | |
| *C08K 3/08* | (2006.01) | |
| *C01F 7/42* | (2006.01) | |
| *C08J 5/04* | (2006.01) | |

(52) U.S. Cl.
CPC ... *C08K 3/22* (2013.01); *C01F 7/42* (2013.01); *C08J 5/044* (2013.01); *C08K 3/08* (2013.01); *C01P 2004/03* (2013.01); *C01P 2004/04* (2013.01); *C01P 2004/16* (2013.01); *C08K 2201/005* (2013.01)

(58) Field of Classification Search
CPC .............. C08K 3/08; C08K 3/22; C01F 7/00; C01F 7/02
USPC .......................................... 423/600; 524/430
See application file for complete search history.

(56) References Cited

U.S. PATENT DOCUMENTS 7,601,262 B1 * 10/2009 Tepper et al. .............. 210/502.1

* cited by examiner

*Primary Examiner* — Richard M Rump
(74) *Attorney, Agent, or Firm* — TransPacific Law Group; Pavel I. Pogodin, Esq.

(57) ABSTRACT

A method for producing a nanocomposite material reinforced by alumina $Al_2O_3$ nanofibers involving synthesizing the alumina Al2O3 nanofibers directly from a melt comprising molten metallic aluminum, the method comprising a controlled liquid phase oxidation of the melt, wherein the synthesized alumina $Al_2O_3$ nanofibers have a diameter between 3 and 45 nm and length of more than 100 nm and combining the synthesized alumina $Al_2O_3$ nanofibers with a polymer matrix to produce the nanocomposite material reinforced by the alumina $Al_2O_3$ nanofibers. The alumina $Al_2O_3$ nanofibers may be monocrystalline alumina $Al_2O_3$ nanofibers. The alumina $Al_2O_3$ nanofibers and the molecules of the polymer may be aligned.

6 Claims, 5 Drawing Sheets

NANOCOMPOSITE MATERIAL CONTAINING ALUMINA NANOFIBERS AND METHOD FOR MAKING SAME

BACKGROUND OF THE INVENTION

1. Field of the Invention

This invention relates in general to nano technology and, more specifically, to technology for manufacturing of nanocomposite materials reinforced with alumina $Al_2O_3$ nanofibers.

2. Description of the Related Art

Nanotechnology deals with developing materials, devices, or other structures having at least one dimension sized between 1 and 100 nanometers. Nanoparticles are the particles having at least one dimension sized between 1 and 100 nanometers. On the other hand, nanofibers are defined as fibers with diameters less than 1000 nanometers. Nanofibers are widely used for manufacturing nanocomposite materials having enhanced properties, such as polymers reinforced by nanoparticles.

At the present time, several kinds of nanoparticles which can be used in the production of nanocomposites are known in the art, including, without limitation, carbon nano tubes (CNT), nano powders produced from silicon carbide, alumina and other materials. Also known in the art are various methods for nanoparticle or nanofiber fabrication, including, without limitation: hydrothermal process, sol gel process, mercury mediated process, flame-spray method, vapor-liquid-solid process as well as electrospinning method.

However, the conventional methods for fabrication of nanoparticles for use in nanocomposites suffer from low production output and, consequently, are expensive and time consuming. For example, a system for enabling a typical electrospinning nanofiber fabrication process consists of three major components: a high-voltage power supply, a spinneret, and an electrically conductive collector. A liquid used in the aforesaid electrospinning technique is fed at a predetermined rate using a syringe or other suitable pump. In many cases, a well-controlled environment (e.g., humidity, temperature, and atmosphere) is critical to the operation of electrospinning, especially for the fabrication of ceramic nanofibers. As would be appreciated by those of skill in the art, these features make the electrospinning process rather expensive as well as resource and time-consuming. The other conventional nanofiber fabrication methods suffer from similar drawbacks and production bottlenecks, which reduce their throughput. In addition, the conventional nanofiber fabrication techniques such as the aforesaid electrospinning process are not suitable for manufacturing metal oxide nanofibers.

Thus, new techniques for manufacturing of nanocomposite materials reinforced with nanoparticles are needed.

SUMMARY OF THE INVENTION

The inventive methodology is directed to methods and systems that substantially obviate one or more of the above and other problems associated with conventional techniques for manufacturing nanocomposite materials.

In accordance with one aspect of the present invention there is provided a a method for producing a nanocomposite material reinforced by alumina $Al_2O_3$ nanofibers comprising: synthesizing the alumina $Al_2O_3$ nanofibers directly from a melt comprising molten metallic aluminum, the method comprising a controlled liquid phase oxidation of the melt, wherein the synthesized alumina $Al_2O_3$ nanofibers have a diameter between 3 and 45 nm and length of more than 100 nm; and combining the synthesized alumina $Al_2O_3$ nanofibers with a polymer matrix to produce the nanocomposite material reinforced by the alumina $Al_2O_3$ nanofibers.

In one or more embodiments, the alumina $Al_2O_3$ nanofibers are monocrystalline alumina $Al_2O_3$ nanofibers.

In one or more embodiments, the alumina $Al_2O_3$ nanofibers are aligned.

In one or more embodiments, the method further includes facilitating the alignment of the alumina $Al_2O_3$ nanofibers.

In one or more embodiments, the melt further comprises at least one of:

a. Vanadium (V) at concentration between 0.000001 and 12 wt. %;
b. Chrome (Cr) at concentration between 0.000001 and 12 wt. %;
c. Manganese (Mn) at concentration between 0.001 and 12 wt. %;
d. Iron (Fe) at concentration between 0.01 and 12 wt. %;
e. Cobalt (Co) at concentration between 0.000001 and 12 wt. %;
f. Nickel (Ni) at concentration between 0.000001 and 12 wt. %;
g. Copper (Cu) at concentration between 0.000001 and 12 wt. %;
h. Zink (Zn) at concentration between 0.000001 and 12 wt. %;
i. Selenium (Se) at concentration between 0.000001 and 12 wt. %;
j. Silicon (Si) at concentration between 0.01 and 12 wt. %;
k. Sulfur (S) at concentration between 0.000001 and 12 wt. %;
l. Tellurium (Te) at concentration between 0.000001 and 12 wt. %;
m. Cerium (Ce) at concentration between 0.000001 and 12 wt. %;
n. Praseodimium (Pr) at concentration between 0.000001 and 12 wt. %;
o. Neodimium (Nd) at concentration between 0.000001 and 12 wt. %;
p. Promethium (Pm) at concentration between 0.000001 and 12 wt. %;
q. Samarium (Sm) at concentration between 0.000001 and 12 wt. %;
r. Europium (Eu) at concentration between 0.000001 and 12 wt. %;
s. Gadolinium (Gd) at concentration between 0.000001 and 12 wt. %;
t. Terbium (Tb) at concentration between 0.000001 and 12 wt. %;
u. Dysprosium (Dy) at concentration between 0.000001 and 12 wt. %;
v. Holmium (Ho) at concentration between 0.000001 and 12 wt. %;
w. Erbium (Er) at concentration between 0.000001 and 12 wt. %;
x. Thulium (Tm) at concentration between 0.000001 and 12 wt. %;
y. Ytterbium (Yb) at concentration between 0.000001 and 12 wt. %; and
z. Lutecium (Lu) at concentration between 0.000001 and 12 wt. %.

wherein a. through z. summed up represent less than 49 wt. % of the melt and wherein all other elements (except for metallic aluminum) represent less than 0.03 wt. % each, and wherein all other elements (except for metallic aluminum) together comprise less than 1 wt. % of the melt.

In one or more embodiments, the synthesis of the alumina $Al_2O_3$ nanofibers is performed at oxygen content between 0.001 and 5 wt. %.

In accordance with another aspect of the present invention there is provided a nanocomposite material reinforced by alumina $Al_2O_3$ nanofibers prepared by a process comprising: synthesizing the alumina $Al_2O_3$ nanofibers directly from a melt comprising molten metallic aluminum, the method comprising a controlled liquid phase oxidation of the melt, wherein the synthesized alumina $Al_2O_3$ nanofibers have a diameter between 3 and 45 nm and length of more than 100 nm; and combining the synthesized alumina $Al_2O_3$ nanofibers with a polymer matrix to produce the nanocomposite material reinforced by the alumina $Al_2O_3$ nanofibers.

In one or more embodiments, the alumina $Al_2O_3$ nanofibers are monocrystalline alumina $Al_2O_3$ nanofibers.

In one or more embodiments, the alumina $Al_2O_3$ nanofibers are aligned.

In one or more embodiments, the melt further comprises at least one of:

aa. Vanadium (V) at concentration between 0.000001 and 12 wt. %;
bb. Chrome (Cr) at concentration between 0.000001 and 12 wt. %;
cc. Manganese (Mn) at concentration between 0.001 and 12 wt. %;
dd. Iron (Fe) at concentration between 0.01 and 12 wt. %;
ee. Cobalt (Co) at concentration between 0.000001 and 12 wt. %;
ff. Nickel (Ni) at concentration between 0.000001 and 12 wt. %;
gg. Copper (Cu) at concentration between 0.000001 and 12 wt. %;
hh. Zink (Zn) at concentration between 0.000001 and 12 wt. %;
ii. Selenium (Se) at concentration between 0.000001 and 12 wt. %;
jj. Silicon (Si) at concentration between 0.01 and 12 wt. %;
kk. Sulfur (S) at concentration between 0.000001 and 12 wt. %;
ll. Tellurium (Te) at concentration between 0.000001 and 12 wt. %;
mm. Cerium (Ce) at concentration between 0.000001 and 12 wt. %;
nn. Praseodimium (Pr) at concentration between 0.000001 and 12 wt. %;
oo. Neodimium (Nd) at concentration between 0.000001 and 12 wt. %;
pp. Promethium (Pm) at concentration between 0.000001 and 12 wt. %;
qq. Samarium (Sm) at concentration between 0.000001 and 12 wt. %;
rr. Europium (Eu) at concentration between 0.000001 and 12 wt. %;
ss. Gadolinium (Gd) at concentration between 0.000001 and 12 wt. %;
tt. Terbium (Tb) at concentration between 0.000001 and 12 wt. %;
uu. Dysprosium (Dy) at concentration between 0.000001 and 12 wt. %;
vv. Holmium (Ho) at concentration between 0.000001 and 12 wt. %;
ww. Erbium (Er) at concentration between 0.000001 and 12 wt. %;
xx. Thulium (Tm) at concentration between 0.000001 and 12 wt. %;
yy. Ytterbium (Yb) at concentration between 0.000001 and 12 wt. %; and
zz. Lutecium (Lu) at concentration between 0.000001 and 12 wt. %.

wherein aa. through zz. summed up represent less than 49 wt. % of the melt and wherein all other elements (except for metallic aluminum) represent less than 0.03 wt. % each, and wherein all other elements (except for metallic aluminum) together comprise less than 1 wt. % of the melt.

In one or more embodiments, the synthesis of the alumina $Al_2O_3$ nanofibers is performed at oxygen content between 0.001 and 5 wt. %.

In accordance with another aspect of the present invention there is provided a nanocomposite material reinforced by alumina $Al_2O_3$ nanofibers prepared by a process comprising: obtaining a melt by heating metallic aluminum in a reactor; controlling oxygen content inside the reactor; adding at least one additive to the melt; performing controlled liquid phase oxidation of the melt by providing additional oxygen into the reactor, wherein the synthesized alumina $Al_2O_3$ nanofibers have a diameter between 3 and 45 nm and length of more than 100 nm; and combining the synthesized alumina $Al_2O_3$ nanofibers with a polymer matrix to produce the nanocomposite material reinforced by the alumina $Al_2O_3$ nanofibers.

In one or more embodiments, the alumina $Al_2O_3$ nanofibers are monocrystalline alumina $Al_2O_3$ nanofibers.

In one or more embodiments, the alumina $Al_2O_3$ nanofibers are aligned.

In one or more embodiments, the melt further comprises at least one of:

aaa. Vanadium (V) at concentration between 0.000001 and 12 wt. %;
bbb. Chrome (Cr) at concentration between 0.000001 and 12 wt. %;
ccc. Manganese (Mn) at concentration between 0.001 and 12 wt. %;
ddd. Iron (Fe) at concentration between 0.01 and 12 wt. %;
eee. Cobalt (Co) at concentration between 0.000001 and 12 wt. %;
fff. Nickel (Ni) at concentration between 0.000001 and 12 wt. %;
ggg. Copper (Cu) at concentration between 0.000001 and 12 wt. %;
hhh. Zink (Zn) at concentration between 0.000001 and 12 wt. %;
iii. Selenium (Se) at concentration between 0.000001 and 12 wt. %;
jjj. Silicon (Si) at concentration between 0.01 and 12 wt. %;
kkk. Sulfur (S) at concentration between 0.000001 and 12 wt. %;
lll. Tellurium (Te) at concentration between 0.000001 and 12 wt. %;
mmm. Cerium (Ce) at concentration between 0.000001 and 12 wt. %;
nnn. Praseodimium (Pr) at concentration between 0.000001 and 12 wt. %;
ooo. Neodimium (Nd) at concentration between 0.000001 and 12 wt. %;
ppp. Promethium (Pm) at concentration between 0.000001 and 12 wt. %;
qqq. Samarium (Sm) at concentration between 0.000001 and 12 wt. %;
rrr. Europium (Eu) at concentration between 0.000001 and 12 wt. %;
sss. Gadolinium (Gd) at concentration between 0.000001 and 12 wt. %;

ttt. Terbium (Tb) at concentration between 0.000001 and 12 wt. %;

uuu. Dysprosium (Dy) at concentration between 0.000001 and 12 wt. %;

vvv. Holmium (Ho) at concentration between 0.000001 and 12 wt. %;

www. Erbium (Er) at concentration between 0.000001 and 12 wt. %;

xxx. Thulium (Tm) at concentration between 0.000001 and 12 wt. %;

yyy. Ytterbium (Yb) at concentration between 0.000001 and 12 wt. %; and zzz. Lutecium (Lu) at concentration between 0.000001 and 12 wt. %.

wherein aaa. through zzz. summed up represent less than 49 wt. % of the melt and wherein all other elements (except for metallic aluminum) represent less than 0.03 wt. % each, and wherein all other elements (except for metallic aluminum) together comprise less than 1 wt. % of the melt.

In one or more embodiments, the synthesis of the alumina $Al_2O_3$ nanofibers is performed at oxygen content between 0.001 and 5 wt. %.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

In accordance with one aspect of the invention, there is provided a method and apparatus for producing a nanocomposite material reinforced by alumina nanofibers. In accordance with one or more embodiments of the invention, at the first step of the inventive process, monocrystalline alumina nanofibers are produced by controlled liquid phase oxidation of aluminum. In one or more embodiments, the alumina nanofibers synthesis method comprises two stages. During the first stage, various additives are introduced into molten metallic aluminum. During the second stage, the alumina nanofibers are synthesized from the resulting melt in the presence of oxygen. In one or more embodiments, the inventive method is performed in a reactor.

Subsequently, at the second process step, the manufactured alumina nanofibers are combinated with a polymer matrix. Upon drying, the resulting nanocomposite material reinforced by alumina nanofibers is produced. In one or more embodiments, the alumina nanofibers act to enhance mechanical, thermal, optical and electrical properties of the polymer base.

The aforesaid two steps of the inventive nanocomposite material synthesis process will now be described in detail. It should be noted that the below description primarily deals with alumina nanofibers possessing two linear dimensions of less than 45 nm. Because the nanofibers described herein have circular cross section, the size of the nanofiber will be specified below by reference to its diameter.

Figure 1:
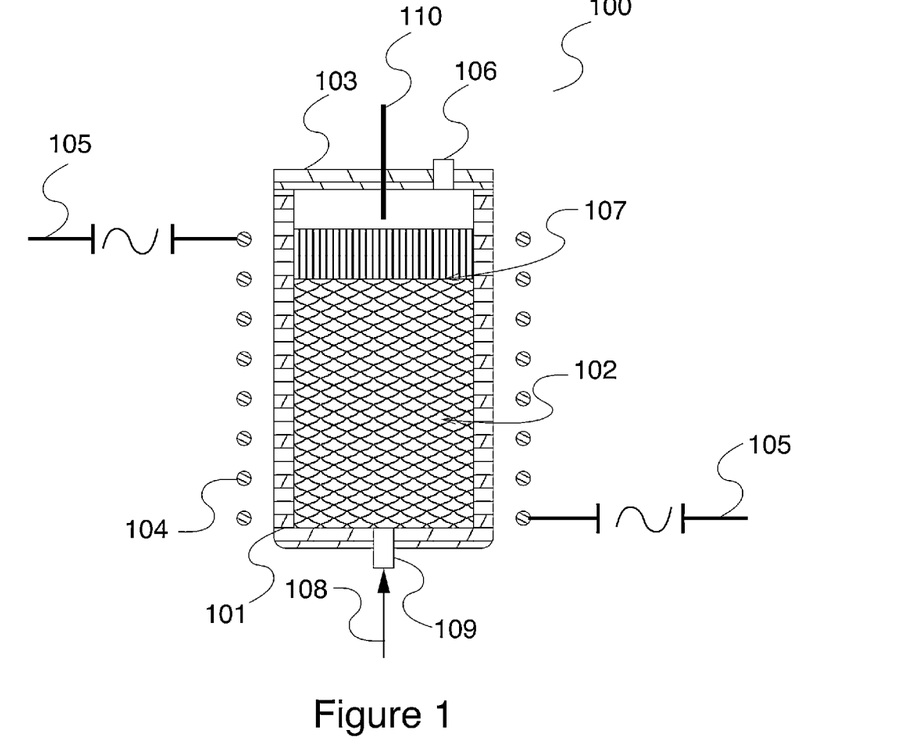
FIG. 1 illustrates an exemplary embodiment of a reactor for synthesis of aluminum oxide nanofibers.

In accordance with one or more embodiments of the invention, the alumina nanaofibers are produced in a reactor. The aforesaid reactor is designed to provide the heating and enable melting of the aluminum. An exemplary embodiment of the reactor 100 is illustrated in FIG. 1. The shown embodiment of the reactor 100 incorporates reactor body 101 enclosing a reaction chamber, which contains the melt 102. The reactor 100 is closed from the top using cover 103, which may incorporate one or more sensor assembly 110 for monitoring various parameters inside the reactor 100, including, without limitation, temperature, pressure and oxygen content. The reactor cover 103 may also incorporate one or more valve assemblies 106 for controlling the atmosphere inside the reactor. In addition, an inlet 109 may be provided in the bottom part of the reactor 100 for injecting various additives and oxygen into the reactor 100, see numeral 108. In one or more embodiments, the content of the reactor may be heated using a suitable induction heating mechanism, which may incorporate induction coil 104 electrically connected to an electric current source 105. The zone of synthesis of aluminum oxide nanofibers is marked in Figure with numeral 107. The oxygen content inside the reactor 100 may be automatically monitored and/or altered using control logic.

In one or more embodiments, the reactor is designed to maintain a sustained temperature of between 660° C. and 1,000° C. When the additives described below are introduced into the molten aluminum, it is desirable to provide steady and uniform the stirring of the melt. To this end, the aforesaid reactor may be provided with a stirring mechanism (not shown in FIG. 1). The construction of the reactor should also provide control over gas composition of the atmosphere during both the introduction of the additives and during the synthesis of the nanofibers. In one or more embodiments, the oxygen content of the atmosphere should be 0.00001 wt. % (weight percent) to 99.9 wt. % depending on the stage of the synthesis process.

Figure 2:
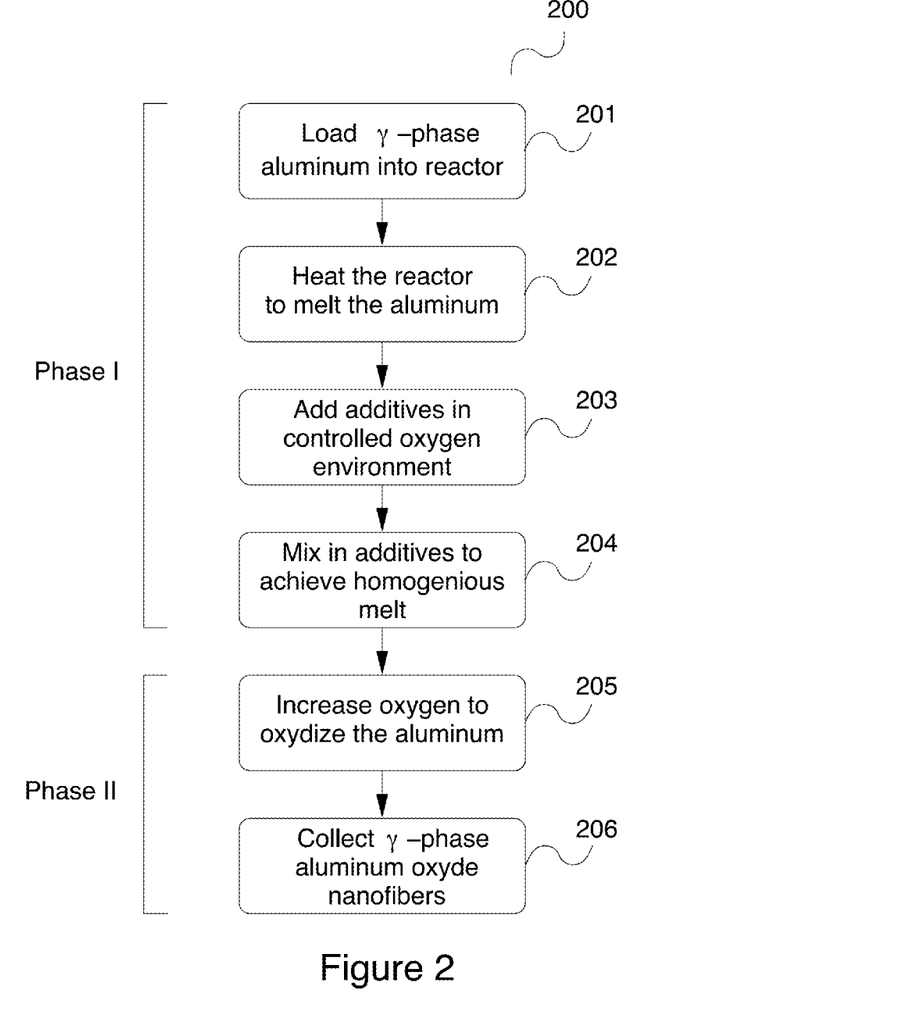
FIG. 2 illustrates an exemplary embodiment of the inventive method for production of aluminum oxide nanofibers.

FIG. 2 illustrates an exemplary embodiment of the inventive method 200 for production of aluminum oxide nanofibers. In accordance with one or more embodiments of the invention, during the first, additive introduction phase (Phase I in FIG. 2) of the inventive process 200, the oxygen content of the atmosphere is kept to the minimal oxygen concentration. On the other hand, during the second, synthesis stage (Phase II in FIG. 2), the oxygen content should be higher, depending on the temperature and the required speed of the nanofiber synthesis process.

In accordance with one or more embodiments of the invention, the heating of the melt is performed using induction heating or electrical resistance heating (ERH, also known as electrical resistive heating) methods, which are well known to persons of ordinary skill in the art. To this end, the reactor may incorporate an appropriate heater. However, the present invention is not limited only to the aforesaid induction heating or electrical resistance heating methods and any other suitable heating method could be utilized for heating, melting and maintaining the required temperature of the material. It should be noted that the heater should preferably provide even heating of the entire volume of the material in the reactor. In addition, in one or more embodiment, the reactor incorporates means for controlling the content of the atmosphere inside the reactor. Construction and methods of application of such means are well known to persons of ordinary skill in the art.

In accordance with one or more embodiments of the invention, in order to synthesize alumina nanofibers, metallic aluminum having purity of 99.7% is first loaded into the reactor 100 in step 201 and melted in the reactor n step 202, see FIG. 2. It should be noted that it is also possible to use other grades of aluminum, as long as the chemical composition of the material described below is achieved. In accordance with one or more embodiments of the invention, the melt is subsequently heated to 900° C., and additives are introduced into the melt to achieve certain predetermined concentrations. It should be noted that even though some exemplary embodiments of the inventive method use gamma-phase aluminum, the invention is not so limited and aluminum in any other suitable phases may be used. Also, other metals may also be used.

In accordance with one or more embodiments of the invention, the following additives are introduced into the heated melt in step 203 to achieve an additive concentration in the range indicated next to the respective additive:

a. Vanadium (V) at concentration between 0.000001 and 12 wt. %;
b. Chrome (Cr) at concentration between 0.000001 and 12 wt. %; p c. Manganese (Mn) at concentration between 0.001 and 12 wt. %;
d. Iron (Fe) at concentration between 0.01 and 12 wt. %;
e. Cobalt (Co) at concentration between 0.000001 and 12 wt. %;
f. Nickel (Ni) at concentration between 0.000001 and 12 wt. %;
g. Copper (Cu) at concentration between 0.000001 and 12 wt. %;
h. Zink (Zn) at concentration between 0.000001 and 12 wt. %;
i. Selenium (Se) at concentration between 0.000001 and 12 wt. %;
j. Silicon (Si) at concentration between 0.01 and 12 wt. %;
k. Sulfur (S) at concentration between 0.000001 and 12 wt. %;
l. Tellurium (Te) at concentration between 0.000001 and 12 wt. %;
m. Cerium (Ce) at concentration between 0.000001 and 12 wt. %;
n. Praseodimium (Pr) at concentration between 0.000001 and 12 wt. %;
o. Neodimium (Nd) at concentration between 0.000001 and 12 wt. %;
p. Promethium (Pm) at concentration between 0.000001 and 12 wt. %;
q. Samarium (Sm) at concentration between 0.000001 and 12 wt. %;
r. Europium (Eu) at concentration between 0.000001 and 12 wt. %;
s. Gadolinium (Gd) at concentration between 0.000001 and 12 wt. %;
t. Terbium (Tb) at concentration between 0.000001 and 12 wt. %;
u. Dysprosium (Dy) at concentration between 0.000001 and 12 wt. %;
v. Holmium (Ho) at concentration between 0.000001 and 12 wt. %;
w. Erbium (Er) at concentration between 0.000001 and 12 wt. %;
x. Thulium (Tm) at concentration between 0.000001 and 12 wt. %;
y. Ytterbium (Yb) at concentration between 0.000001 and 12 wt. %; and
z. Lutecium (Lu) at concentration between 0.000001 and 12 wt. %.

In one or more embodiments, a. through z. above summed up represent less than 49 wt. % of the molten metallic aluminum, all other elements (except for aluminum) represent less than 0.03 wt. % each, and all other elements (except for aluminum) together comprise less than 1 wt. % of the molten metallic aluminum.

In accordance with one or more embodiments of the invention, the aforesaid additives are introduced into the melt not in their pure form, but as part of compositions and/or alloys. This may facilitate the dissolution of the respective additives in the melt and result in a higher degree of homogeneity of the melt.

In one embodiment of the inventive technique, one or more of the aforesaid additives are introduced into the melt in a solid powder form. In an alternative embodiment, the additives may be introduced in a pre-melted form. To facilitate attaining the proper homogeneity of the resulting melt, in one or more embodiments, the stirring mechanism may be used in the reactor 100 to perform mixing in of the additives in step 204, see FIG. 2.

In accordance with one or more embodiments of the invention, once suitably homogeneous melt is obtained, oxygen is introduced into the melt, see step 205. In one or more embodiments, oxygen is introduced through melt's surface by means of diffusion. In another embodiment, oxygen is injected into the melt using an injector. Finally, in an alternative embodiment, oxygen is introduced into the melt through introducing a composition or compositions of oxygen with one or more of the following chemical elements: Vanadium (V), Chrome (Cr), Manganese (Mn), Iron (Fe), Cobalt (Co), Nickel (Ni), Cuprum (Cu), Zink (Zn), Selenium (Se), Silicon (Si), Sulfur (S), Tellurium (Te), Cerium (Ce), Praseodimium (Pr), Neodimium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Lutecium (Lu).

In accordance with one or more embodiments of the invention, oxygen is introduced up to a concentration of 0.001 to 5 wt. %. Once oxygen is introduced and reaches the indicated concentration, the synthesis of nanofibers takes place either on the surface of the melt or on a boundary between the molten aluminum and another medium. In one or more embodiments, the grown monocrystalline alumina $Al_2O_3$ nanofibers are harvested from the surface of the molten metallic aluminum or from the boundary of the molten metallic aluminum and another medium. In accordance with one or more embodiments of the invention, the synthesis of the monocrystalline alumina $Al_2O_3$ nanofibers is performed within temperature range of the molten metallic aluminum from 660° C. to 1000° C. Finally, the aluminum nanofibers are collected at step 206. In one or more embodiments, the aluminum nanofibers are synthesized in gamma phase. In various alternative embodiments, the alumina nanofibers may be synthesized in Xi phase or other phases, depending on the specific parameters of the synthesis process.

In accordance with one or more embodiments of the invention, it order to insure continuous nanofiber synthesis process, it is desirable to provide a steady supply of oxygen to the reactor to maintain oxygen concentration within desired limits. In addition, the chemical composition of the melt and the temperature should also be appropriately maintained within proper limits during the synthesis process.

As the alumina nanofibers are formed on the surface of the melt during the synthesis process, they can be harvested from the melt's surface. The diameter of the produced nanofibers can be controlled through the parameters of the synthesis process, such as temperature and chemical composition of the melt. On the other hand, the length of the produced nanofibers is determined by synthesis time. In one or more embodiments, the nanofiber synthesis speed may vary from 0.01 mm/hour to 100 mm/hour. It should be noted that the described method may also be utilized to synthesize polycrystalline alumina nanofibers by changing the synthesis conditions during the synthesis process and/or by applying an external action on the surface of the molten aluminum.

The alumina nanofibers produced according to techniques described above are subsequently combined with the polymer matrix. The composition of the nanofibers in the polymer matrix may range from above zero to 100 wt. %. In one or more embodiments, the composition ranged between 1 wt. % and 4 wt. %. In one or more embodiments, the polymer matrix comprises block copolymers, thermoplastics, liquid crystal polymers, thermosets, gel processed polymers and elastomers. In one or more embodiments, the polymer matrix is a transparent polymer matrix. In one or more embodiments, the alumina nanofibers are combined with the polymer matrix in a presence of water and/or other solvent(s). In one or more embodiments, the polymer matrix is selected from a group comprising: poly(meth)acrylate, polystyrene, polyester, polycarbonate, polyolefin, polyamide, polyurethane, polyacetal, polyvinyl acetal, polyvinyl ketal, vinyl polymer or copolymer comprising vinyl monomer selected from (meth) acrylate ester, aromatic vinyl, vinyl cyanide, vinyl halide and vinylidene halide; preferably it is selected from the group of polyalkylene terephthalate, polycarbonate of bisphenol compound, vinyl polymer or copolymer comprising vinyl monomer selected from methyl methacrylate, styrene and acrylonitrile and any combinations thereof. In one or more embodiment, the polymer matrix may comprise an epoxy-based polymer.

In one or more embodiments, the alumina nanofibers in the polymer matrix as well as the polymer molecules may be aligned (oriented in the same direction). To this end, the polymer matrix and the alumina nanofibers may be subject to hydrodynamic stresses in order to facilitate the alignment of the alumina nanofibers and the polymer molecules. In alternative embodiments, the alumina nanofibers and the polymer molecules may self-align.

Figure 3:
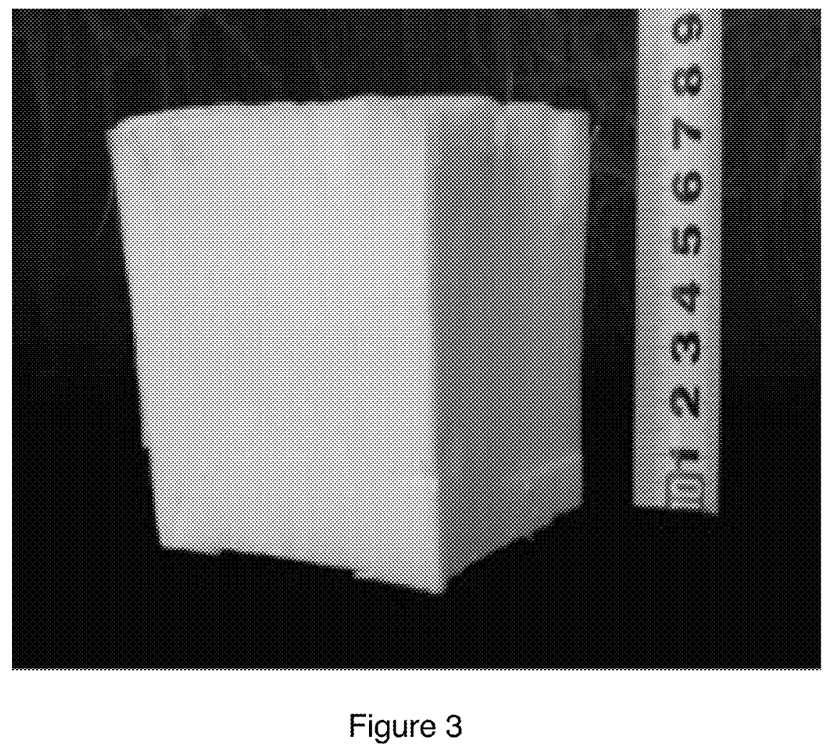
FIG. 3 shows a photograph of alumina nanofibers manufactured using techniques described herein.

It should be noted that the alumina nanofibers obtained using the described technique may grow to have lengths of several centimeters, as illustrated in FIG. 3. The produced nanofibers are also characterized by substantial strength and flexibility. Because of the large aspect ratio (ratio of the length to diameter) of the produced nanofibers, a very strong and durable bonding between the nanofibers and the polymer matrix is achieved resulting in a very flexible, hard and durable nanocomposite material. Moreover, because the nanofibers are synthesized in gamma phase and have very active surface, very substantial reinforcement of the polymer is achieved coupled with an easy dispersion of the nanofibers into practically all polymers (both thermosetting and thermoplastic), resins, polyesters, epoxies as well as other suitable materials. Because of the strong reinforcement ability of the alumina nanofibers described herein, the amount of the nanofiber material in the polymer matrix may be small (between 0.1 and 5 wt. %) without compromising the characteristics of the resulting nanocomposite.

In one or more embodiments, the resulting nanocomposite is transparent due to the nano size of the used reinforcement nanofibers and a small concentration thereof in the polymer matrix. In addition, the nanocomposite is non-conductive (electrically insulating). Furthermore, because alumina has very low thermal conductivity, the resulting nanocomposite has strong thermo-protective properties. As would be appreciated by those of skill in the art, the described embodiments of the nanocomposite manufacturing technique involve no high-temperature (plasma) nanoparticles being introduced into the nanocomposite.

The nanocomposites based on the disclosed alumina nanofibers may be manufactured using well known in the art industrial manufacturing techniques including, without limitation, melt blending or in-situ polymerization. Such production methods may be used, for example, to manufacture nanofiber-reinforced polymer pellets. Subsequently, conventional production methods including extrusion, injection molding, reaction injection molding and the like may be applied to the nano-composite pellets to produce the final products. The products containing materials described herein may be used in a variety of different industries including transportation, automotive, aerospace, defense, sporting goods, energy and infrastructure.

It should be noted that the introduction of alumina nanofibers into polymer matrix in accordance with techniques described herein leads to much more substantial enhancement of mechanical properties of the polymer compared to other reinforcing agents, such as, for example, carbon nanotubes. This is due to more active surface properties of the gamma-phase alumina compared with carbon and substantially larger surface area of the nanofibers described herein. For example, the micro-mechanical interlocking, which is the amount of load transfer due to mechanical interlocking, is very poor in carbon nanotubes because of the atomically smooth surface of the nanotubes. On the other hand, the same characteristic is much improved in case of the described alumina nanofibers in gamma phase.

Another exemplary characteristic is chemical bonding between the reinforcing agent and the polymer matrix. The chemical bond, which is either ionic or covalent significantly improves the interfacial interaction between matrix and the filler that enables a better stress transfer. This chemical bonding is essentially absent in case of polymers reinforced with carbon nanotubes. van der Waals bonding between filler and matrix is the only mode of interaction between carbon nanotubes and the polymer matrix in absence of chemical bonding. However, it degrades strongly for many polymers reinforced with carbon nanotubes. On the other hand, the chemical bonding is much improved in the described nanocomposites reinforced with described alumina nanofibers.

Figure 4:
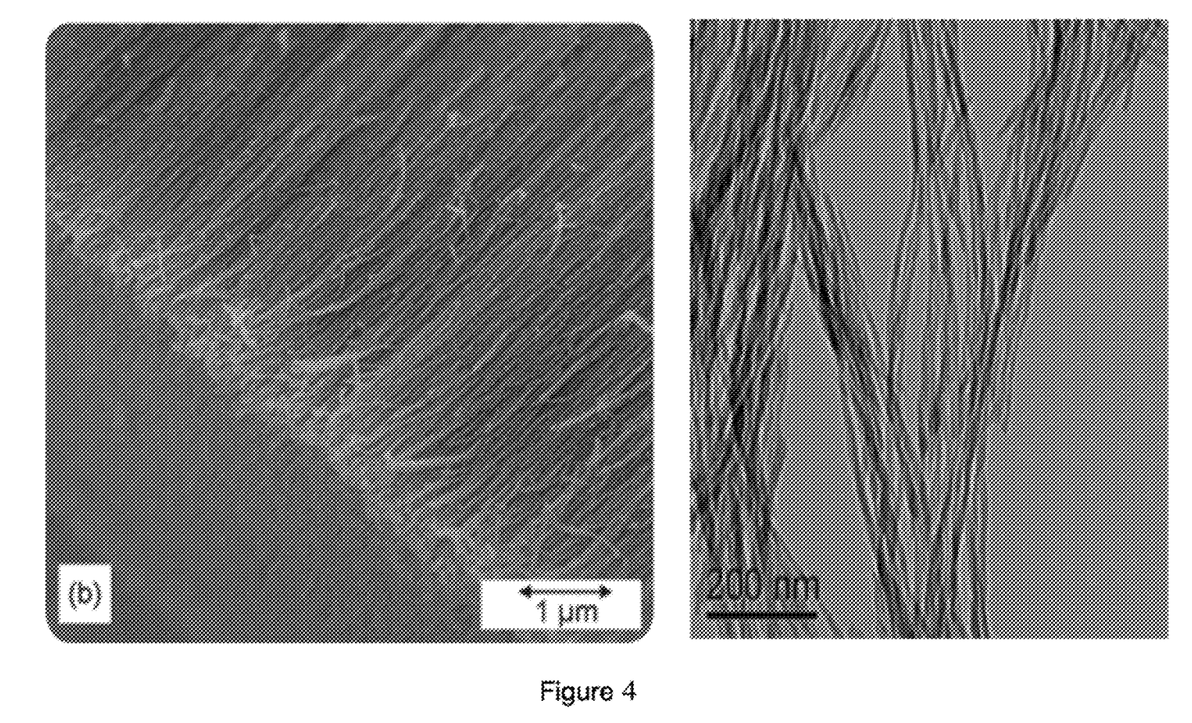
FIG. 4 illustrates a magnified photograph of alumina nanofibers manufactured using techniques described herein.
Figure 5:
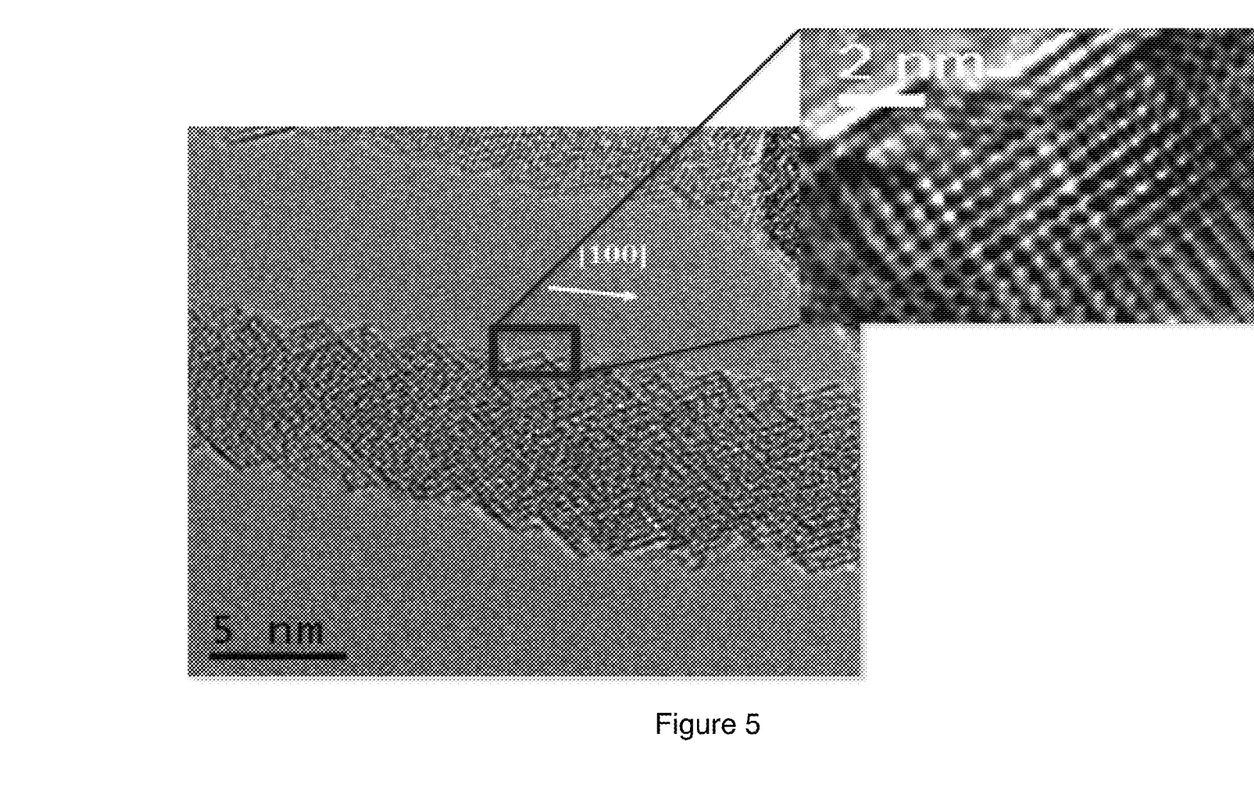
FIG. 5 illustrates a magnified photograph of a surface of an alumina nanofiber manufactured using techniques described herein.

FIG. 4 illustrates a magnified photograph of alumina nanofibers manufactured using techniques described herein, while FIG. 5 illustrates a highly magnified photograph of a surface of one alumina nanofiber.

Moreover, other implementations of the invention will be apparent to those skilled in the art from consideration of the specification and practice of the invention disclosed herein. Various aspects and/or components of the described embodiments may be used singly or in any combination in the process for manufacturing nanocomposite materials. It is intended that the specification and examples be considered as exemplary only, with a true scope and spirit of the invention being indicated by the following claims.

What is claimed is:

1. A method for producing a nanocomposite material reinforced by alumina $Al_2O_3$ nanofibers comprising:
   a. synthesizing the alumina $Al_2O_3$ nanofibers directly from a melt comprising molten metallic aluminum, the method comprising a controlled liquid phase oxidation of the melt, wherein the synthesized alumina $Al_2O_3$ nanofibers have a diameter between 3 and 45 nm and length of more than 100 nm; and
   b. combining the synthesized alumina $Al_2O_3$ nanofibers with a polymer matrix to produce the nanocomposite material reinforced by the alumina $Al_2O_3$ nanofibers.

2. The method of claim 1, wherein the alumina $Al_2O_3$ nanofibers are monocrystalline alumina $Al_2O_3$ nanofibers.

3. The method of claim 1, wherein the alumina $Al_2O_3$ nanofibers are aligned.

4. The method of claim 1, further comprising facilitating the alignment of the alumina $Al_2O_3$ nanofibers.

5. The method of claim 1, wherein the melt further comprises at least one of:
   a. Vanadium (V) at concentration between 0.000001 and 12 wt. %;
   b. Chrome (Cr) at concentration between 0.000001 and 12 wt. %;
   c. Manganese (Mn) at concentration between 0.001 and 12 wt. %;
   d. Iron (Fe) at concentration between 0.01 and 12 wt. %;
   e. Cobalt (Co) at concentration between 0.000001 and 12 wt. %;
   f. Nickel (Ni) at concentration between 0.000001 and 12 wt. %;
   g. Copper (Cu) at concentration between 0.000001 and 12 wt. %;
   h. Zink (Zn) at concentration between 0.000001 and 12 wt. %;
   i. Selenium (Se) at concentration between 0.000001 and 12 wt. %;
   j. Silicon (Si) at concentration between 0.01 and 12 wt. %;
   k. Sulfur (S) at concentration between 0.000001 and 12 wt. %;
   l. Tellurium (Te) at concentration between 0.000001 and 12 wt. %;
   m. Cerium (Ce) at concentration between 0.000001 and 12 wt. %;
   n. Praseodimium (Pr) at concentration between 0.000001 and 12 wt. %;
   o. Neodimium (Nd) at concentration between 0.000001 and 12 wt. %;
   p. Promethium (Pm) at concentration between 0.000001 and 12 wt. %;
   q. Samarium (Sm) at concentration between 0.000001 and 12 wt. %;
   r. Europium (Eu) at concentration between 0.000001 and 12 wt. %;
   s. Gadolinium (Gd) at concentration between 0.000001 and 12 wt. %;
   t. Terbium (Tb) at concentration between 0.000001 and 12 wt. %;
   u. Dysprosium (Dy) at concentration between 0.000001 and 12 wt. %;
   v. Holmium (Ho) at concentration between 0.000001 and 12 wt. %;
   w. Erbium (Er) at concentration between 0.000001 and 12 wt. %;
   x. Thulium (Tm) at concentration between 0.000001 and 12 wt. %;
   y. Ytterbium (Yb) at concentration between 0.000001 and 12 wt. %; and
   z. Lutecium (Lu) at concentration between 0.000001 and 12 wt. %,
   wherein a. through z. summed up represent less than 49 wt. % of the melt and wherein all other elements (except for metallic aluminum) represent less than 0.03 wt. % each, and wherein all other elements (except for metallic aluminum) together comprise less than 1 wt. % of the melt.

6. The method of claim 1, wherein the synthesis of the alumina $Al_2O_3$ nanofibers is performed at oxygen content between 0.001 and 5 wt. %.

* * * * *